US012618886B2

(12) United States Patent
Tobon et al.

(10) Patent No.: US 12,618,886 B2
(45) Date of Patent: May 5, 2026

(54) POWER CONVERSION APPARATUS, DETERIORATION DETERMINATION METHOD FOR SMOOTHING CAPACITOR

(71) Applicant: Hitachi Industrial Equipment Systems Co., Ltd., Tokyo (JP)

(72) Inventors: Mendez Mauricio Tobon, Tokyo (JP); Masato Ohya, Tokyo (JP); Kazushige Hotta, Tokyo (JP); Yusaku Onuma, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 215 days.

(21) Appl. No.: 18/567,063

(22) PCT Filed: Oct. 5, 2021

(86) PCT No.: PCT/JP2021/036867
§ 371 (c)(1),
(2) Date: Dec. 5, 2023

(87) PCT Pub. No.: WO2023/058127
PCT Pub. Date: Apr. 13, 2023

(65) Prior Publication Data
US 2024/0264213 A1 Aug. 8, 2024

(51) Int. Cl.
*G01R 31/01* (2020.01)
*G01R 27/26* (2006.01)
(Continued)

(52) U.S. Cl.
CPC ....... *G01R 31/016* (2013.01); *G01R 27/2605* (2013.01); *G01R 31/282* (2013.01); *H02M 1/0009* (2021.05); *H02M 7/48* (2013.01)

(58) Field of Classification Search
CPC ........ G01R 27/00; G01R 27/02; G01R 27/26; G01R 27/2605; G01R 31/00; G01R 31/01;
(Continued)

(56) References Cited

U.S. PATENT DOCUMENTS

2016/0315575 A1 10/2016 Yamamoto et al.
2020/0251982 A1 8/2020 Foube
2020/0274437 A1 8/2020 Deguchi

FOREIGN PATENT DOCUMENTS

CN 103718449 A * 4/2014 ............ H02J 7/0036
CN 105340163 A * 2/2016 ............. H02M 1/32
(Continued)

OTHER PUBLICATIONS

Extended European Search Report issued in European Application No. 21959869.5 dated Apr. 23, 2025 (8 pages).
(Continued)

*Primary Examiner* — Hoai-An D. Nguyen
(74) *Attorney, Agent, or Firm* — Crowell & Moring LLP

(57) ABSTRACT

A capacitance acquiring unit acquires a plurality of initial capacitance values indicating capacitance values of a smoothing capacitor in an initial state and acquires a plurality of operation capacitance values indicating capacitance values of the smoothing capacitor in an operation state, and a deterioration determining unit acquires characteristic information indicating a relationship between AC power and the capacitance value of the smoothing capacitor in the initial state on the basis of a statistic amount of the plurality of initial capacitance values acquired by the capacitance acquiring unit and determines a deterioration state of the smoothing capacitor on the basis of a statistic amount of the plurality of operation capacitance values acquired by the capacitance acquiring unit and the characteristic information.

10 Claims, 11 Drawing Sheets

(51) Int. Cl.

| | | |
|---|---|---|
| *G01R 31/28* | (2006.01) | |
| *H02M 1/00* | (2007.01) | |
| *H02M 7/48* | (2007.01) | |

(58) Field of Classification Search

CPC .... G01R 31/013; G01R 31/016; G01R 31/28; G01R 31/282; G01R 31/2822; G01R 31/40; G01R 31/42; G01R 31/50; G01R 31/64; H02M 1/00; H02M 1/0003; H02M 1/0009; H02M 1/14; H02M 7/00; H02M 7/42; H02M 7/44; H02M 7/48; H02M 7/53; H02M 7/537; H02M 7/5387; H02M 1/32; H02M 7/53871

USPC ........................................ 324/600, 649, 658

See application file for complete search history.

(56) References Cited

FOREIGN PATENT DOCUMENTS

| CN | 106100503 | A | | 11/2016 | | |
|---|---|---|---|---|---|---|
| DE | 102016004774 | B4 | * | 2/2020 | ............. | G01R 31/00 |
| EP | 3 379 713 | A1 | | 9/2018 | | |
| EP | 4 002 670 | A1 | | 5/2022 | | |
| JP | 2006-333661 | A | | 12/2006 | | |
| JP | 2007-60866 | A | | 3/2007 | | |
| JP | 2009-168587 | A | | 7/2009 | | |
| JP | 2010-160001 | A | | 7/2010 | | |
| JP | 2015056919 | A | * | 3/2015 | ............. | H02P 27/06 |
| JP | 2018191446 | A | * | 11/2018 | ........... | H02M 7/003 |
| JP | 2020-141465 | A | | 9/2020 | | |
| WO | WO 2017/085825 | A1 | | 5/2017 | | |
| WO | WO 2021/009831 | A1 | | 1/2021 | | |
| WO | WO-2021149203 | A1 | * | 7/2021 | ............. | H02P 29/50 |

OTHER PUBLICATIONS

International Search Report (PCT/ISA/210) issued in PCT Application No. PCT/JP2021/036867 dated Dec. 14, 2021 with Engiish transiation (4 pages).

Japanese-language Written Opinion (PCT/ISA/237) issued in PCT Application No. PCT/JP2021/036867 dated Dec. 14, 2021 with English transiation (5 pages).

Chinese-language Office Action issued in Taiwanese Application No. 111127174 dated Nov. 30, 2022 with English transiation (15 pages).

* cited by examiner

POWER CONVERSION APPARATUS, DETERIORATION DETERMINATION METHOD FOR SMOOTHING CAPACITOR

TECHNICAL FIELD

The present invention relates to a power conversion apparatus and a deterioration determination method for a smoothing capacitor in the power conversion apparatus.

BACKGROUND ART

In general, a power conversion apparatus for motor drive has a smoothing capacitor for smoothing DC power. In this smoothing capacitor, with repetition of charging/discharging, deterioration gradually progresses, and when a degree of deterioration becomes large, it leads to defective control of an output voltage in the power conversion apparatus or deterioration of a switching element used for conversion from DC power to AC power. Thus, appropriate evaluation of the degree of deterioration of the smoothing capacitor is in demand.

With respect to the evaluation of the degree of deterioration of the smoothing capacitor, an art described in PTL 1, for example, is known. PTL 1 discloses an apparatus for deciding presence/absence of deterioration by calculating a capacitance of a main-circuit capacitor in a certain period during which a voltage change rate of the main-circuit capacitor is negative and a constant value.

CITATION LIST

Patent Literature

[PTL 1] Japanese Patent Application Publication No. 2010-160001

SUMMARY OF INVENTION

Technical Problem

Since a smoothing capacitor mounted on a power conversion apparatus needs a large capacitance in general, an electrolytic capacitor is employed. However, the electrolytic capacitor has large variation in initial capacitance due to manufacture and thus, the deterioration state cannot be appropriately evaluated in some cases with the art described in PTL 1.

On the ground of the aforementioned problem, a major object of the present invention is to appropriately evaluate a deterioration state of a smoothing capacitor in a power conversion apparatus without stopping an operation of the power conversion apparatus.

Solution to Problem

A power conversion apparatus according to the present invention comprises: a power conversion unit that converts DC power to AC power and outputs the AC power; a smoothing capacitor that smoothens the DC power; a capacitance acquiring unit that acquires a capacitance value of the smoothing capacitor; and a deterioration determining unit that determines a deterioration state of the smoothing capacitor, wherein the capacitance acquiring unit acquires a plurality of initial capacitance values indicating capacitance values of the smoothing capacitor in an initial state in accordance with a change in an operation state of the power conversion unit and acquires a plurality of operation capacitance values indicating capacitance values of the smoothing capacitor in an operation state; and the deterioration determining unit: acquires characteristic information indicating a relationship between the AC power and the capacitance value of the smoothing capacitor in the initial state on the basis of a statistic amount of the plurality of initial capacitance values acquired by the capacitance acquiring unit; and determines a deterioration state of the smoothing capacitor on the basis of a statistic amount of the plurality of operation capacitance values acquired by the capacitance acquiring unit and the characteristic information.

A deterioration determination method according to the present invention is a method for determining a deterioration state of a smoothing capacitor which is coupled to a power conversion unit and smoothens DC power, the power conversion unit converting the DC power to AC power and outputting the AC power, comprising: acquiring a plurality of initial capacitance values indicating capacitance values of the smoothing capacitor in an initial state in accordance with a change in an operation state of the power conversion unit; acquiring characteristic information indicating a relationship between the AC power and a capacitance value of the smoothing capacitor in the initial state on the basis of a statistic amount of the plurality of acquired initial capacitance values; acquiring a plurality of operation capacitance values indicating capacitance values of the smoothing capacitor in an operation state; and determining a deterioration state of the smoothing capacitor on the basis of a statistic amount of the plurality of acquired operation capacitance values and the characteristic information.

Advantageous Effects of Invention

According to the present invention, the deterioration state of the smoothing capacitor in the power conversion apparatus can be appropriately evaluated without stopping the operation of the power conversion apparatus.

DESCRIPTION OF EMBODIMENTS

Hereinafter, Embodiments of the present invention will be explained.

First Embodiment

Figure 1:
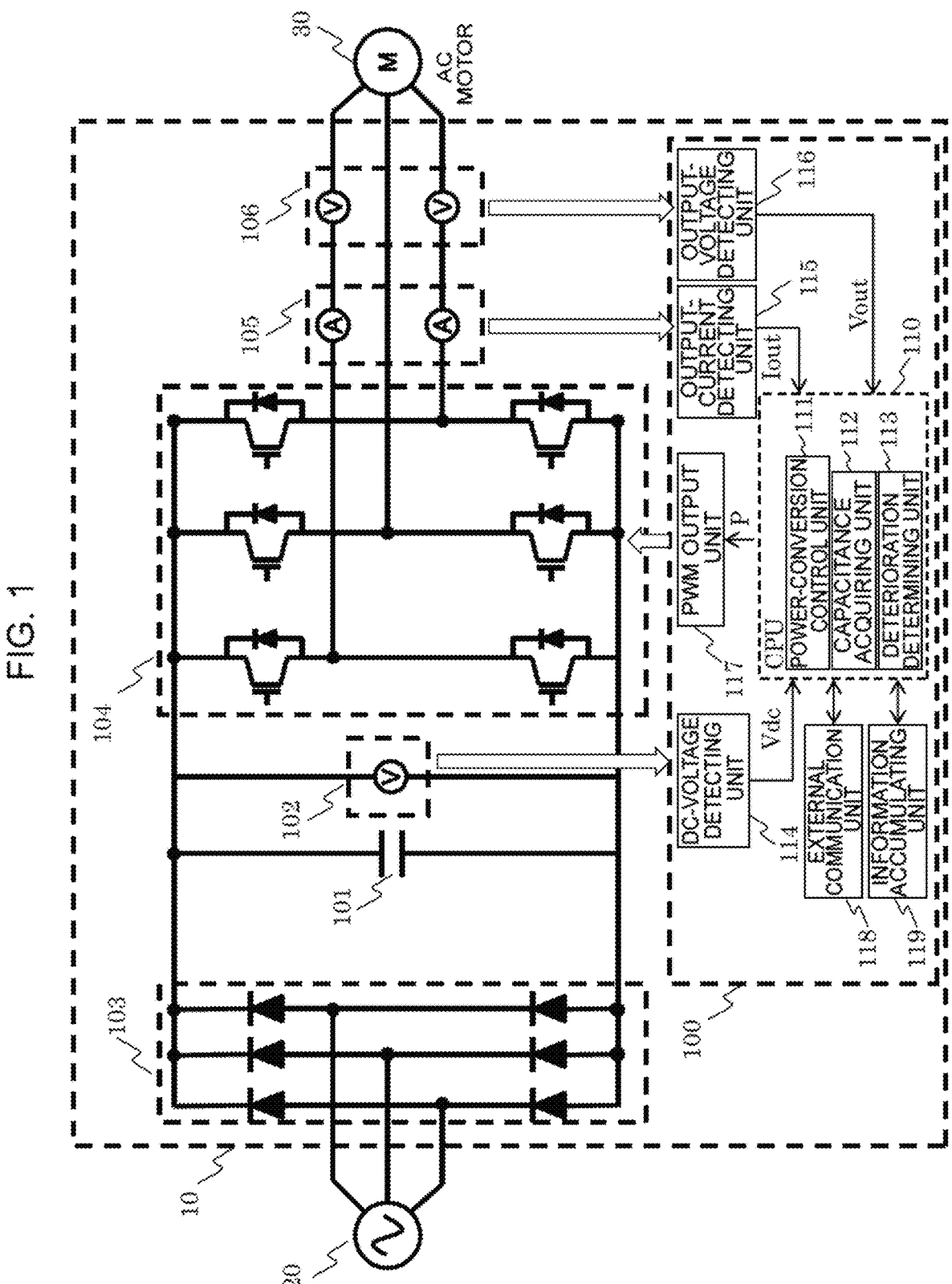
FIG. 1 is a schematic configuration diagram of a motor-drive system using a power conversion apparatus according to a First Embodiment of the present invention.

FIG. 1 is a schematic configuration diagram of a motor-drive system using a power conversion apparatus 10 according to a First Embodiment of the present invention. This motor-drive system includes the power conversion apparatus 10 which supplies power to a control target, a three-phase AC power source 20 which supplies power to the power conversion apparatus 10, and an AC motor 30, which is the control target.

The three-phase AC power source 20 supplies power to the power conversion apparatus 10. Specifically, it supplies the three-phase AC power supplied from an electric power company or the AC power supplied from a power generator. It is to be noted that, in place of the three-phase AC power source 20, a DC power source which supplies DC power may be coupled to the power conversion apparatus 10.

The power conversion apparatus 10 includes a control unit 100, a smoothing capacitor 101, a DC-voltage detector 102, a first power-conversion unit 103, a second power-conversion unit 104, an output-current detector 105, and an output-voltage detector 106.

The first power-conversion unit 103 converts an AC power input from the three-phase AC power source 20 to DC power and outputs it to the smoothing capacitor 101. The first power-conversion unit 103 is constituted by a DC conversion circuit constituted by a diode or a DC conversion circuit using an IGBT (Insulated Gate Bipolar Transistor) and a flywheel diode, for example. In FIG. 1, a DC conversion circuit constituted by a diode is illustrated as an example. It is to be noted that, in a case where the DC power source is coupled to the power conversion apparatus 10 instead of the three-phase AC power source 20 as described above, the first power-conversion unit 103 is not necessary.

The smoothing capacitor 101 smoothens DC power input from the first power-conversion unit 103 and outputs it to the second power-conversion unit 104. The smoothing capacitor 101 is constituted by using an electrolytic capacitor, for example.

The second power-conversion unit 104 converts the DC power input from the first power-conversion unit 103 via the smoothing capacitor 101 to AC power and outputs it to the AC motor 30. The second power-conversion unit 104 has a voltage or a frequency of the AC power to be output controlled by control of an operation thereof in accordance with a drive signal input from the control unit 100. As shown in FIG. 1, the second power-conversion unit 104 is constituted by an AC conversion circuit using an IGBT and a flywheel diode, for example.

The output-current detector 105 and the output-voltage detector 106 detect an output current and an output voltage from the second power-conversion unit 104 to the AC motor 30, respectively, and output detection signals corresponding to detection results thereof to the control unit 100. The output-current detector 105 is constituted by a hall CT (Current Transformer) using a Hall element as a detection element or a shunt resistance, for example, and the output-voltage detector 106 is constituted by a combination of a resistor and a voltage sensor, for example. It is to be noted that positions of the output-current detector 105 and the output-voltage detector 106 are not limited to the positions in FIG. 1 but may be at a spot where measurement of the output current or the output voltage to the AC motor 30 is possible such as an inside of the second power-conversion unit 104, for example.

Moreover, in FIG. 1, among three-phase output lines coupled between the second power-conversion unit 104 and the AC motor 30, the output-current detector 105 and the output-voltage detector 106 are provided only on two-phase output lines, respectively. In this case, from the detection results of the two-phase output current and output voltage, the output current and the output voltage of the remaining one phase can be acquired. Alternatively, it may be so configured that the output-current detector 105 and the output-voltage detector 106 are provided also on the remaining one-phase output line, and the output current and the output voltage are detected.

The DC-voltage detector 102 detects a DC voltage by a DC power input from the first power-conversion unit 103 to the second power-conversion unit 104 via the smoothing capacitor 101 and outputs a detection signal according to the detection result to the control unit 100. The DC-voltage detector 102 is constituted by a combination of a resistor and a voltage sensor, for example. It is to be noted that a position of the DC-voltage detector 102 is not limited to the position in FIG. 1 but may be anywhere as long as the voltage of the DC power input into the second power-conversion unit 104, that is, the voltage of the smoothing capacitor 101 can be detected.

Subsequently, the control unit 100 will be explained. The control unit 100 includes a CPU 110, a DC-voltage detecting unit 114, an output-current detecting unit 115, an output-voltage detecting unit 116, a PWM output unit 117, an external communication unit 118, and an information accumulating unit 119.

The DC-voltage detecting unit 114 handles a detection signal output by the DC-voltage detector 102 as an input, converts it to a DC voltage Vdc which is data for computation, and outputs it to the CPU 110. The DC-voltage detecting unit 114 is constituted by an AD converter or the like, for example.

The output-current detecting unit 115 handles a detection signal output by the output-current detector 105 as an input, converts it to an output current Iout which is data for computation, and outputs it to the CPU 110. The output-current detecting unit 115 is constituted by the AD converter or the like, for example.

The output-voltage detecting unit 116 handles a detection signal output by the output-voltage detector 106 as an input, converts it to an output voltage Vout which is data for computation, and outputs it to the CPU 110. The output-voltage detecting unit 116 is constituted by the AD converter or the like, for example.

The CPU 110 is constituted by using an arithmetic unit such as an MCU (Micro Controller Unit), FPGA (Field Programmable Gate Array) or the like, and various types of arithmetic processing related to control of the power conversion apparatus 10 are executed by a calculation circuit of software or hardware. The CPU 110 has, as its functions, each of functional blocks of a power-conversion control unit 111, a capacitance acquiring unit 112, and a deterioration determining unit 113.

The power-conversion control unit 111 controls the second power-conversion unit 104 on the basis of an output instruction input from an outside of the power conversion apparatus 10. The power-conversion control unit 111 executes predetermined PWM control on the basis of the DC voltage Vdc and the output current Iout input from the DC-voltage detecting unit 114 and the output-current detecting unit 115, respectively, for example, whereby a PWM signal P according to the output instruction is generated and is output to the PWM output unit 117. In accordance with this PWM signal P, the PWM output unit 117 outputs a drive signal to the second power-conversion unit 104, whereby the second power-conversion unit 104 can be controlled.

The capacitance acquiring unit 112 acquires a capacitance value of the smoothing capacitor 101. In this Embodiment, the capacitance acquiring unit 112 calculates a capacitance value of the smoothing capacitor 101 on the basis of the DC voltage Vdc, the output current Iout, and the output voltage Vout indicated by the data for computation detected by the DC-voltage detector 102, the output-current detector 105, and the output-voltage detector 106, respectively, and input from the DC-voltage detecting unit 114, the output-current detecting unit 115, and the output-voltage detecting unit 116, respectively. It is to be noted that a specific calculating method of the capacitance value of the smoothing capacitor 101 by the capacitance acquiring unit 112 will be described later.

The deterioration determining unit 113 determines a deterioration state of the smoothing capacitor 101 on the basis of the capacitance value acquired by the capacitance acquiring unit 112. In this Embodiment, the deterioration determining unit 113 calculates statistic amounts of a plurality of capacitance values acquired by the capacitance acquiring unit 112 and determines the deterioration state of the smoothing capacitor 101 on the basis of the statistic amounts. It is to be noted that a specific determination method of the deterioration state of the smoothing capacitor 101 by the deterioration determining unit 113 will be described later.

The external communication unit 118 executes interface processing of a communication signal input/output between outside the power conversion apparatus 10 and the CPU 110. The external communication unit 118 is constituted by a LAN controller, for example. An output instruction transmitted from the outside of the power conversion apparatus 10 is received by this external communication unit 118 and is output to the CPU 110 and is used for control of the second power-conversion unit 104 by the power-conversion control unit 111.

The information accumulating unit 119 accumulates information output from the CPU 110 and outputs the accumulated information to the CPU 110 in response to a request from the CPU 110. The information accumulating unit 119 is configured by a nonvolatile recording medium such as an HDD (Hard Disk Drive) and an SSD (Solid State Drive), for example.

Subsequently, the determination of the deterioration state of the smoothing capacitor 101 in the power conversion apparatus 10 of this Embodiment will be explained.

Figure 2:
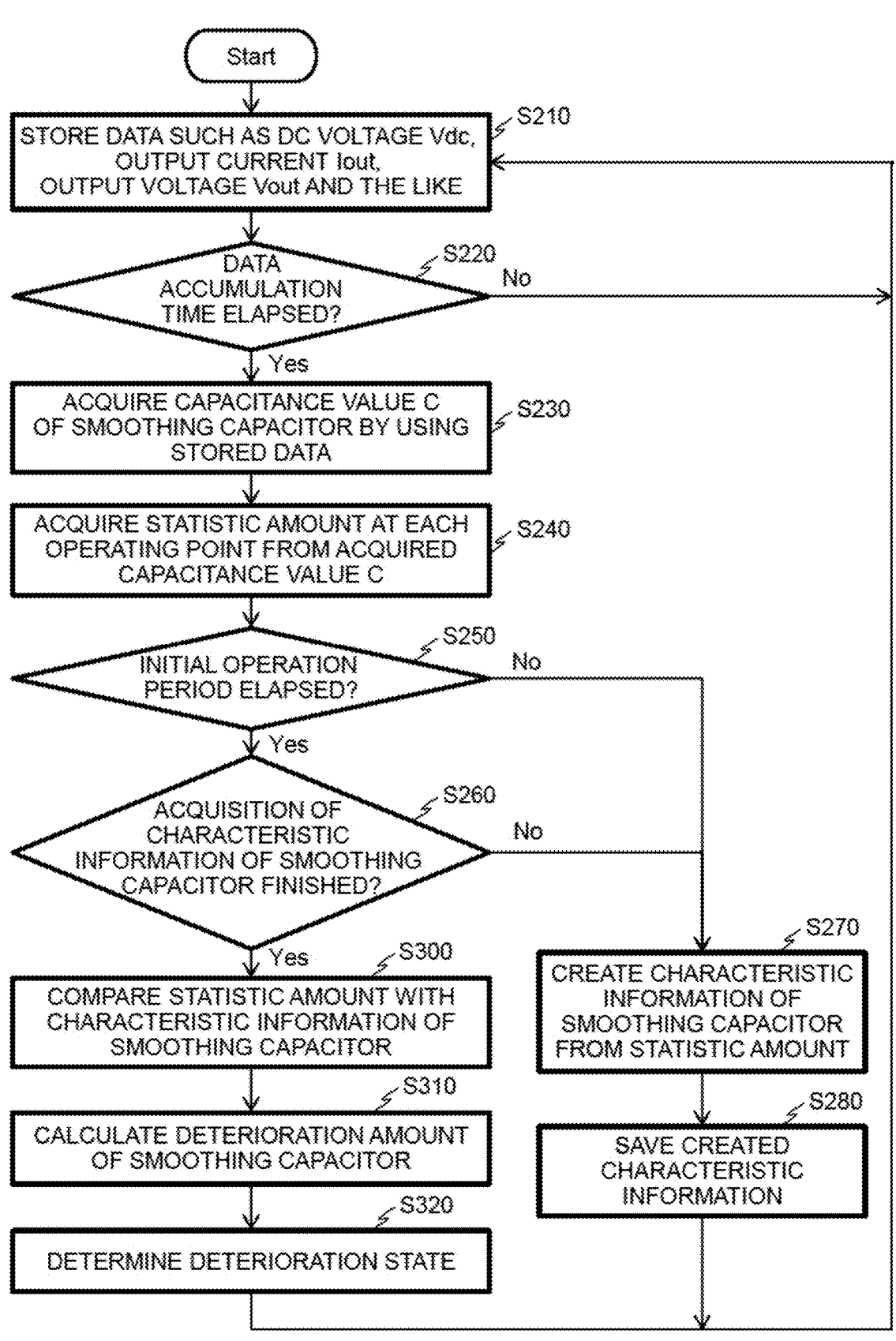
FIG. 2 is a flowchart of a smoothing-capacitor deterioration-determination processing according to the First Embodiment of the present invention.

FIG. 2 is a flowchart of smoothing-capacitor deterioration-determination processing according to the First Embodiment of the present invention. In the power conversion apparatus 10 of this Embodiment, in the CPU 110 of the control unit 100, the deterioration state of the smoothing capacitor 101 is determined by execution of the processing indicated in the flowchart in FIG. 2 at each predetermined operation period.

At Step S210, the CPU 110 acquires data of the DC voltage Vdc, the output current Iout, and the output voltage Vout from the DC-voltage detecting unit 114, the output-current detecting unit 115, the output-voltage detecting unit 116, respectively, and accumulates them in the information accumulating unit 119.

At Step S220, the CPU 110 determines whether predetermined data accumulation time has elapsed or not since the accumulation of data was started at Step S210. If the data accumulation time has not elapsed, the processing returns to Step S210, and data accumulation of the DC voltage Vdc, the output current Iout, and the output voltage Vout is continued, while if the data accumulation time has elapsed, the processing in FIG. 2 proceeds to subsequent Step S230. It is to be noted that the data accumulation time used for determination at Step S220 is time during which the number of pieces of data sufficient for calculating a statistic amount of a capacitance value at Step S240, which will be described later, can be acquired and is set in advance in the CPU 110.

At Step S230, the CPU 110 acquires a capacitance value C of the smoothing capacitor 101 by using the data accumulated in the information accumulating unit 119 by the capacitance acquiring unit 112 during the data accumulation time by the processing at Step S210. Here, the capacitance values C can be calculated in plural as follows, for example.

The electric power input to/output from the smoothing capacitor 101 can be assumed to be equal to AC power generated by the second power-conversion unit 104 and output from the power conversion apparatus 10. This relationship is expressed by the following formula (1) by using the DC voltage Vdc, the output current Iout, and the output voltage Vout:

$$Vdc \times Ic = \sqrt{3} \times Vout \times Iout \times \cos\theta \qquad (1)$$

In the formula (1), Ic denotes a capacitor current flowing through the smoothing capacitor 101. Moreover, cos θ denotes a power factor of AC power output from the power conversion apparatus 10, and this can be acquired from a phase difference θ between the output current Iout and the output voltage Vout.

Moreover, the capacitor current Ic is, as expressed in the following formula (2), acquired by a product between the capacitance value C of the smoothing capacitor 101 and a time differential value of the DC voltage Vdc. In the formula (2), t denotes time.

$$Ic = C \times d(Vdc)/d(t) \qquad (2)$$

Here, in order to simplify arithmetic processing in the CPU 110, when the time differential value d(Vdc)/d(t) of the DC voltage Vdc in the formula (2) is substituted by a change rate of the DC voltage Vdc accumulated in each arithmetic period, the formula (2) can be deformed to the following formula (3). In the formula (3), Δt expresses an arithmetic period, and ΔVdc expresses a difference of the DC voltage Vdc between two pieces of data continuing in a time series:

$$Ic = C \times \Delta Vdc/\Delta t \qquad (3)$$

7                                                    8

When the mathematical formula acquired by substituting the formula (3) in the formula (1) is solved for the capacitance value C, the following formula (4) is obtained:

$$C = \sqrt{3} \times Vout \times Iout \times \cos\theta / (Vdc \times \Delta Vdc / \Delta t) \qquad (4)$$

At Step S230, on the basis of each data of the DC voltage Vdc, the output current Iout, and the output voltage Vout accumulated in the information accumulating unit 119, the capacitance value C of the smoothing capacitor 101 at each point of time when the data was obtained can be acquired by the formula (4).

It is to be noted that in a case where it is determined at Step S250, which will be described later, that an initial operation period has not elapsed or it is determined at Step S260 that acquisition of characteristic information of the smoothing capacitor 101 is continued, each of the capacitance values C acquired at Step S230 is handled as an initial capacitance value indicating a capacitance value in an initial state of the smoothing capacitor 101 in processing of the subsequent Step S270. On the other hand, in a case where it is determined at Step S250 that the initial operation period has elapsed and it is determined at Step S260 that the acquisition of the characteristic information of the smoothing capacitor 101 is finished, in the processing at the subsequent Step S300, it is handled as an operation capacitance value indicating a capacitance value in an operation state of the smoothing capacitor 101. That is, in this Embodiment, the capacitance acquiring unit 112 calculates the initial capacitance value on the basis of the DC voltage Vdc, the output current Iout, and the output voltage Vout detected by the DC-voltage detector 102, the output-current detector 105, and the output-voltage detector 106, respectively, when the smoothing capacitor 101 is in the initial state. Moreover, the operation capacitance value is calculated on the basis of the DC voltage Vdc, the output current Iout, and the output voltage Vout detected by the DC-voltage detector 102, the output-current detector 105, and the output-voltage detector 106, respectively, when the smoothing capacitor 101 is in the operation state after the initial state. As a result, a plurality of the initial capacitance values can be acquired in the initial state, and a plurality of the operation capacitance values can be acquired in the operation state.

At Step S240, the CPU 110 acquires the statistic amount of the capacitance value C at each operating point in the initial state or the operation state by the deterioration determining unit 113 from the capacitance value C of the smoothing capacitor 101 at each point of time acquired at Step S230. Here, at each operating point set by separating the values of the AC power output from the power conversion apparatus 10 by each predetermined range, statistic amounts such as an average value, a median value, standard deviation, an upper fence, and a lower fence are calculated as the statistic amounts of the capacitance value C.

It is to be noted that, the upper fence UIF and the lower fence LIF are expressed by the following formulas (5), (6), respectively, for example. In the formulas (5), (6), Q1, Q3 denote the first quartile (25 percentile) and the third quartile (75 percentile) with respect to all the capacitance values C at the operating point, respectively, and IQR denotes an interquartile range (difference between Q3 and Q1).

$$UIF = Q3 + 1.5 \times IQR \qquad (5)$$

$$LIF = Q1 - 1.5 \times IQR \qquad (6)$$

Each data of the DC voltage Vdc, the output current Iout, and the output voltage Vout accumulated in the information accumulating unit 119 includes an error caused by fluctuation, a noise or the like in a peripheral environment. This error becomes larger for the data when the power output from the power conversion apparatus 10 is low. Thus, in the capacitance value C calculated at Step S230, an error is generated with respect to the capacitance value of the actual smoothing capacitor 101 in response to the error in these pieces of data. Thus, in the power conversion apparatus 10 in this Embodiment, the error included in the capacitance value C is removed by handling the capacitance value C statistically by executing processing at Step S240.

Figure 3:
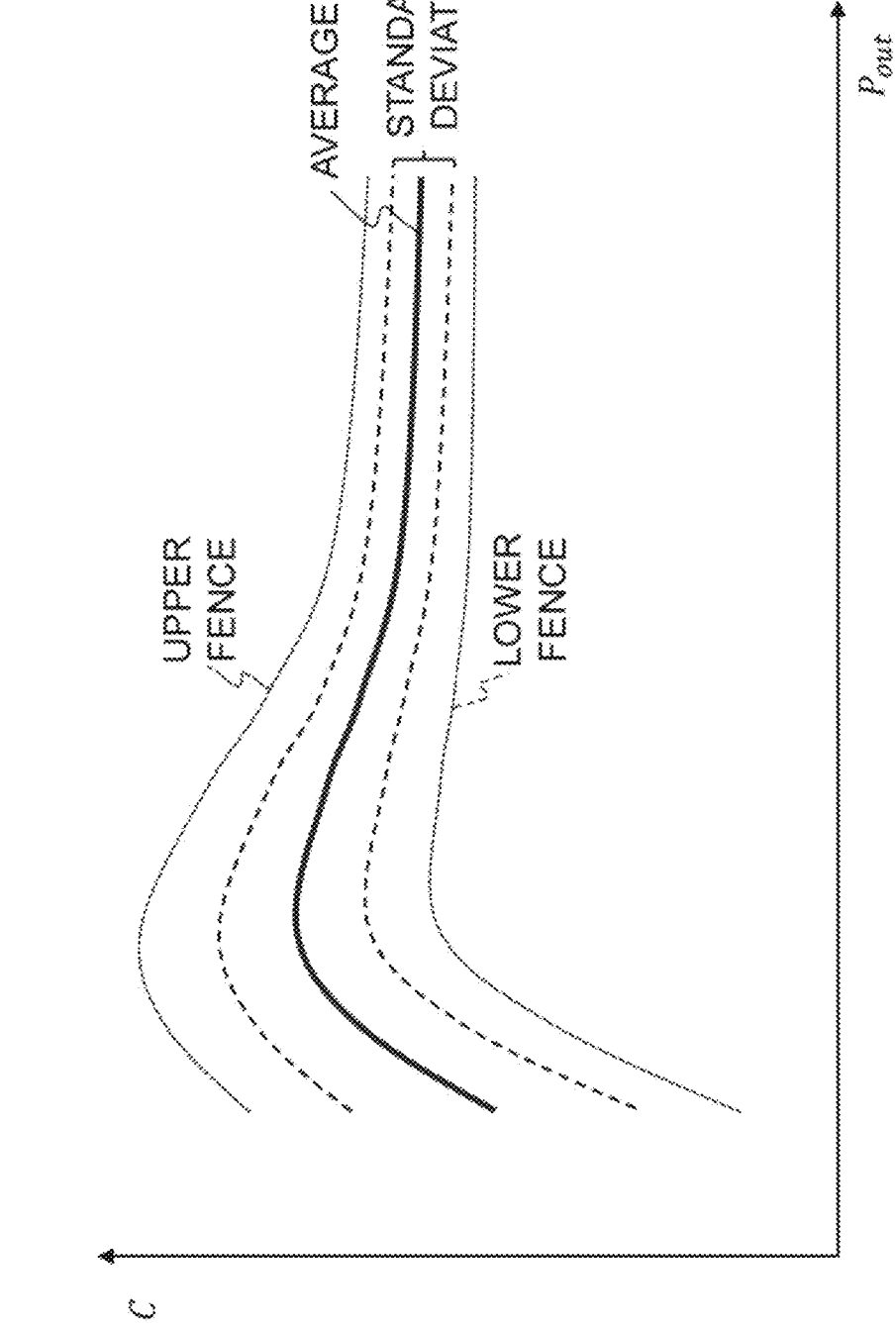
FIG. 3 is a diagram illustrating an example of a statistic amount of a capacitance value at each operating point.

FIG. 3 is a diagram illustrating an example of the statistic amount of the capacitance value C at each operating point calculated at Step S240. In FIG. 3, a lateral axis indicates AC power Pout output from the power conversion apparatus 10, while a vertical axis indicates the capacitance value C. In FIG. 3, an example is shown in which a plurality of operating points are set by separating the AC power Pout by a predetermined range, that is, 1 W each, for example, and each of the statistic amounts such as the average, the standard deviation, the upper fence, and the lower fence of the capacitance value C calculated at each operating point are made into a graph. It is to be noted that the statistic amount of the capacitance value C shown in FIG. 3 is an example, and other statistic amounts such as the median value instead of the average value may be calculated.

Returning to the explanation for FIG. 2, at Step S250, the CPU 110 determines whether or not the predetermined initial operation period has elapsed since the operation of the power conversion apparatus 10 was started. Here, whether the initial operation period has elapsed or not is determined on the basis of the number of data accumulated so far in the information accumulating unit 119 at the aforementioned Step S210 and an accumulated value of operation time of the second power-conversion unit 104 from the operation start point of time as follows, for example.

When the operation of the power conversion apparatus 10 is started, the CPU 110 acquires each data of the DC voltage Vdc, the output current Iout, and the output voltage Vout as data related to the capacitance value C of the smoothing capacitor 101 for each predetermined arithmetic period at the aforementioned Step S210 and accumulates them in the information accumulating unit 119. At Step S250, if the number of these pieces of data having been acquired and accumulated so far in the information accumulating unit 119 is less than a reference number set in advance, it is determined that the initial operation period has not elapsed yet. On the other hand, if the number of pieces of data accumulated in the information accumulating unit 119 is equal to or larger than the reference number set in advance, it is determined that the initial operation period has elapsed. It is to be noted that the aforementioned reference number can be set in advance at design development of the power conversion apparatus 10 or the like as such data number that reliability of characteristic information of the smoothing capacitor 101 created at Step S270, which will be described later, becomes sufficiently high. As described above, for example, whether the initial operation period has elapsed or not can be determined.

Alternatively, in the CPU 110, an accumulated value of the operation time of the second power-conversion unit 104 from the operation start point of time to the current time of the power conversion apparatus 10 is measured as the operation period of the smoothing capacitor 101. At Step S250, if the accumulated value of this operation time is less than the reference time set in advance, it is determined that the initial operation time has not elapsed yet. On the other hand, if the accumulated value of the operation time of the second power-conversion unit 104 is equal to or larger than the reference time set in advance, it is determined that the initial operation time has elapsed. It is to be noted that the aforementioned reference time can be set in advance at the design development of the power conversion apparatus 10 or the like as such time that reliability of characteristic information of the smoothing capacitor 101 generated at Step S270, which will be described later, becomes sufficiently high. As described above, for example, whether the initial operation period has elapsed or not can be determined.

It is to be noted that the reference number or the reference time used as a determination condition of the initial operation period in the processing at Step S250 may be changed or adjusted in accordance with a use environment (temperature or the like) of the power conversion apparatus 10 or may be changed for each user who uses the power conversion apparatus 10. For example, the reference number or the reference time different from those of the other users may be set for a specific user with strict use environment.

Moreover, the determination processing at Step S250 may be executed by combining the two determination methods described above. In that case, it may be determined that the initial operation period has elapsed when either one of the conditions is satisfied or it may be determined that the initial operation period has elapsed when the both conditions are satisfied.

Furthermore, the determination processing at Step S250 may be executed by a method other than the above. If it can be appropriately determined whether the initial operation period has elapsed or not, the determination processing at Step S250 can be executed by using an arbitrary determination condition.

If it is determined that the initial operation period has not elapsed yet by the determination processing at Step S250, the processing in FIG. 2 is caused to proceed to Step S270. On the other hand, if it is determined that the initial operation period has elapsed, the processing in FIG. 2 is caused to proceed to Step S260.

At Step S260, the CPU 110 determines whether or not to end the acquisition of the characteristic information of the smoothing capacitor 101. Here, on the basis of a distribution state of the operating points where the statistic amounts of the capacitance values C have been calculated at the aforementioned Step S240, it is determined whether the acquisition of the characteristic information of the smoothing capacitor 101 is to be ended or is to be continued without ending as follows, for example.

For example, it is determined, in the range of the AC power which can be output by the second power-conversion unit 104 in the power conversion apparatus 10, whether the statistic amounts of the capacitance values C have been calculated or not for each of the operating points in a predetermined power range set in advance as an acquisition target range of the characteristic information of the smoothing capacitor 101. As a result, if there are equal to or larger than a predetermined number of the operating points for which the statistic amounts of the capacitance values C in the power range have been calculated, it is decided that the statistic amounts in a sufficient amount as the characteristic information of the smoothing capacitor 101 have been acquired, and it is determined that the acquisition of the characteristic information is to be ended. On the other hand, if the number of the operating points for which the statistic amounts of the capacitance values C have been calculated is less than a predetermined number, it is decided that the statistic amounts in the sufficient amount as the characteristic information of the smoothing capacitor 101 have not been acquired yet, and it is determined that the acquisition of the characteristic information is not ended but continued. In this case, even after the initial operation time has elapsed, the capacitance value C acquired at Step S230 executed after that is handled as the initial capacitance value of the smoothing capacitor 101. As described above, on the basis of the distribution state of the operating points for which the statistic amounts of the capacitance values C have been calculated, whether to continue or to end the acquisition of the characteristic information can be determined at Step S260.

It is to be noted that the acquisition target range of the characteristic information or the number of operating points used as the determination condition of the Step S260 may be determined in advance at the design development of the power conversion apparatus 10 or the like or may be changed or adjusted in accordance with the use environment (temperature or the like) of the power conversion apparatus 10. Alternatively, it may be changed for each user who uses the power conversion apparatus 10. For example, the determination condition different from those of the other users may be set for a specific user with strict use environment.

Moreover, if it is determined at Step S260 that the acquisition of the characteristic information is not to be ended, in the processing after that, the second power-conversion unit 104 may be controlled by the power-conversion control unit 111 so that the power conversion apparatus 10 is operated at the operating point for which the statistic amount of the capacitance value C has not been calculated yet.

At Step S260, if it is determined that the statistic amount in a sufficient amount as the characteristic information of the smoothing capacitor 101 has not been acquired yet and thus, the acquisition of the characteristic information is not to be ended but to be continued, the processing in FIG. 2 is caused to proceed to Step S270. On the other hand, if it is determined that the statistic amount in a sufficient amount as the characteristic information of the smoothing capacitor 101 has been acquired and thus, the acquisition of the characteristic information is to be ended, the processing in FIG. 2 is caused to proceed to Step S300.

When the processing proceeds from Step S250 or Step S260 to Step S270, at Step S270, the CPU 110 generates the characteristic information of the smoothing capacitor 101 on the basis of the statistic amount of the capacitance value C acquired at Step S240, that is, the statistic amount of the plurality of initial capacitance values acquired for the smoothing capacitor 101 in the initial state by the deterioration determining unit 113. Here, on the basis of each of the statistic amounts such as the average value, the median value, the standard deviation, the upper fence, the lower fence and the like of the capacitance value C acquired for each of the operating points at Step S240, for example, a relationship between the AC power Pout and each of the statistic amounts is made into a graph as shown in the aforementioned FIG. 3, and this is made the characteristic information of the smoothing capacitor 101. As a result, the characteristic information indicating a relationship between the AC power Pout output from the power conversion apparatus 10 and the capacitance value C in the initial state of the smoothing capacitor 101 can be generated at Step S270. It is to be noted that the characteristic information may be generated by a method other than the above, as long as the relationship between the AC power Pout and the capacitance value C can be appropriately indicated.

At Step S280, the CPU 110 accumulates and stores the characteristic information generated at Step S270 in the information accumulating unit 119.

When the processing proceeds from Step S260 to Step S300, at Step S300, the CPU 110 compares the statistic amount of the capacitance value C acquired at Step S240, that is, the statistic amounts of the plurality of operation capacitance values acquired for the smoothing capacitor 101 in the operation state after the initial state with the already-stored characteristic information of the smoothing capacitor 101, by the deterioration determining unit 113. Here, the statistic amount of the operation capacitance value and the characteristic information are compared as follows, for example.

As described above, at Step S240, for the plurality of capacitance values C calculated on the basis of the data accumulated at Step S210, the statistic amounts such as the average value, the median value, the standard deviation, the upper fence, the lower fence and the like are calculated for each operating point. By comparing the statistic amount at each operating point with the already-stored characteristic information, the processing at Step S300 is executed.

Figure 4:
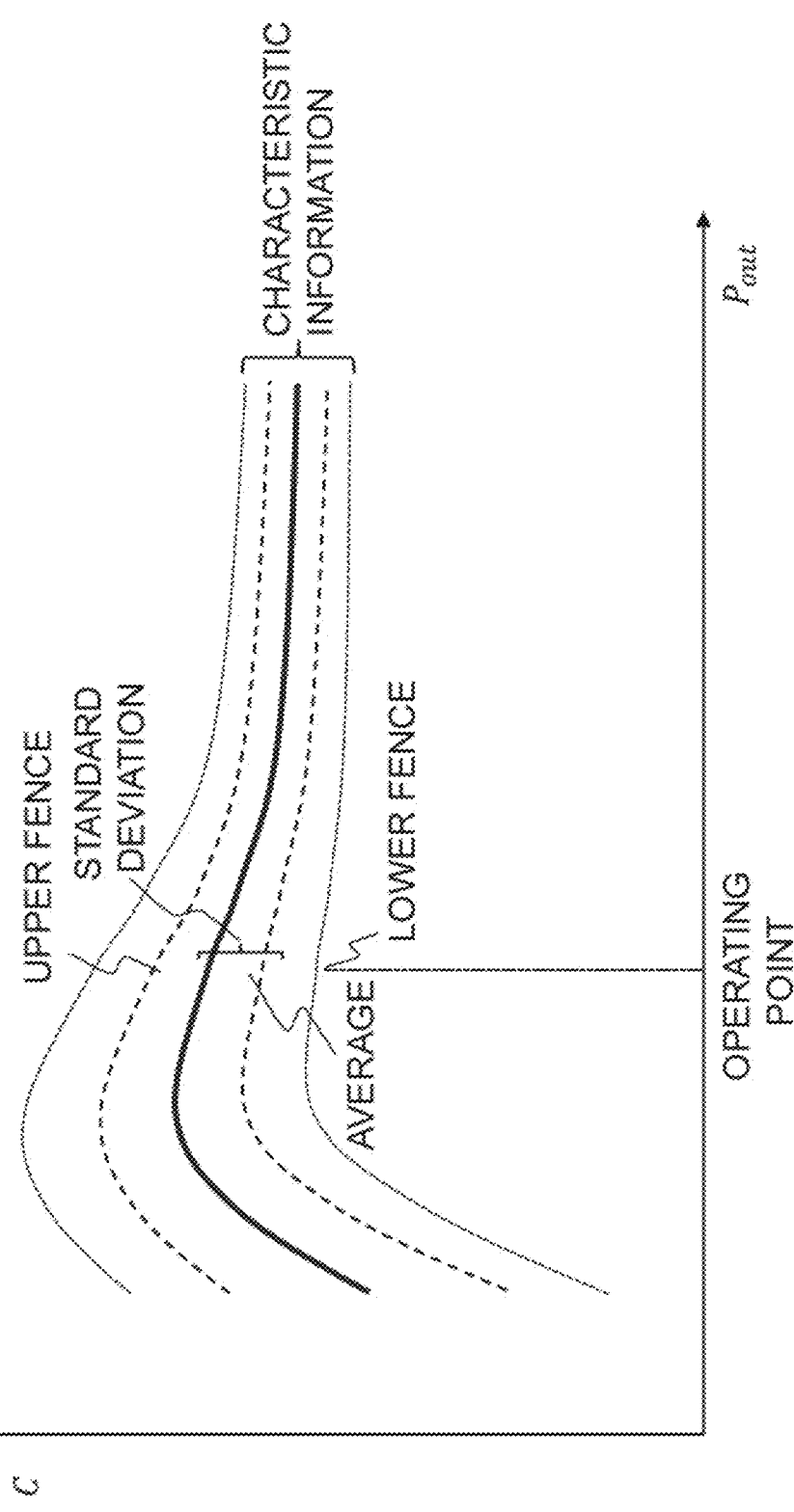
FIG. 4 is a diagram illustrating a comparison example of the statistic amount and characteristic information.

FIG. 4 is a diagram illustrating a comparison example of the statistic amount and the characteristic information made at Step S300. In FIG. 4, a graph indicated by each of solid-line and broken-line curves indicates each of the statistic amounts in FIG. 3 stored as the characteristic information. Moreover, the average, the standard deviation, the upper fence, and the lower fence shown in the figure indicate each of the statistic amounts calculated at Step S240 for a certain operating point. At Step S300, these statistic amounts and the value corresponding to the operating point in each of the graphs of the characteristic information are compared, respectively.

Returning to the explanation for FIG. 2, at Step S310, the CPU 110 calculates a deterioration amount of the smoothing capacitor 101 by the deterioration determining unit 113 on the basis of a comparison result at Step S300. Here, by means of a formula (7) below, for example, the deterioration amount Dc of the smoothing capacitor 101 is calculated. In the formula (7), Cs denotes the statistic amount calculated at Step S240, and C0 denotes the characteristic information.

$$Dc = (Cs/C0) \times 100 \ [\%] \tag{7}$$

When the deterioration amount Dc is to be calculated by the formula (7), the same type of statistic amount needs to be used for the statistic amount Cs and the characteristic information C0. For example, when an average of the operation capacitance value is employed for the statistic amount Cs, the deterioration amount Dc is calculated by employing an average of the initial capacitance value for the characteristic information C0. As a result, on the basis of the result of comparison between the averages of the statistic amounts and the characteristic information at Step S300, respectively, the deterioration amount Dc can be calculated at Step S310. It is to be noted that the deterioration amount Dc can be calculated in a similar method also for the statistic amounts other than the average, that is, the standard deviation, the upper fence, the lower fence and the like, for example.

At Step S320, the CPU 110 determines the deterioration state of the smoothing capacitor 101 on the basis of the deterioration amount calculated by the deterioration determining unit 113 at Step S310. Here, the deterioration amount Dc calculated by the aforementioned formula (7) is compared with a predetermined threshold value (80%, for example), for example, and if the deterioration amount Dc is equal to or larger than the threshold value, it is determined that the smoothing capacitor 101 has not deteriorated. On the other hand, if the deterioration amount Dc is less than the threshold value, it is determined that the smoothing capacitor 101 is in the deterioration state. At step S320, the deterioration state of the smoothing capacitor 101 can be determined on the basis of the comparison result between the deterioration amount and the threshold value as above, for example. It is to be noted that, the determination processing at Step S320 may be executed by using a method other than the above, as long as the deterioration state of the smoothing capacitor 101 can be appropriately determined.

When the processing at Step S280 or Step S320 is executed, the CPU 110 returns to Step S210 and continues data accumulation of the DC voltage Vdc, the output current Iout, and the output voltage Vout. It is to be noted that, if it is determined that the smoothing capacitor 101 is in the deterioration state at Step S320, the deterioration of the smoothing capacitor 101 may be notified to the user by outputting a predetermined alarm sound or an alarm display.

According to the First Embodiment of the present invention described above, the following operations and effects are exerted.

(1) The power conversion apparatus 10 includes the second power-conversion unit 104 that converts the DC power to the AC power and outputs it, the smoothing capacitor 101 that smoothens the DC power, the capacitance acquiring unit 112 that acquires the capacitance value of the smoothing capacitor 101, and the deterioration determining unit 113 that determines the deterioration state of the smoothing capacitor 101. The capacitance acquiring unit 112 acquires a plurality of the initial capacitance values indicating the capacitance values of the smoothing capacitor 101 in the initial state in accordance with a change in the operation state of the second power-conversion unit 104 and acquires a plurality of the operation capacitance values indicating the capacitance values of the smoothing capacitor 101 in the operation state (Step S230). The deterioration determining unit 113 acquires the characteristic information indicating the relationship between the AC power and the capacitance value of the smoothing capacitor 101 in the initial state on the basis of the statistic amount of the plurality of initial capacitance values acquired by the capacitance acquiring unit 112 (Step S270) and determines the deterioration state of the smoothing capacitor 101 on the basis of the statistic amount of the plurality of operation capacitance values acquired by the capacitance acquiring unit 112 and the characteristic information (Steps S300 to S320). By configuring as above, the deterioration state of the smoothing capacitor 101 in the power conversion apparatus 10 can be appropriately evaluated without stopping the operation of the power conversion apparatus 10.

(2) The deterioration determining unit 113 calculates the deterioration amount Dc of the smoothing capacitor 101 on the basis of the statistic amount of the operation capacitance value and the characteristic information (Steps S300, S310) and determines the deterioration state of the smoothing capacitor 101 on the basis of the comparison result between the calculated deterioration amount Dc and the predetermined threshold value (Step S320). By configuring as above, the deterioration state of the smoothing capacitor 101 can be accurately determined.

(3) The deterioration determining unit 113 calculates the statistic amount including at least any one of the average value, the median value, the standard deviation, the upper fence, and the lower fence of the initial capacitance value at each operating point set by separating the values of the AC power by each predetermined range (Step S240), and acquires the characteristic information on the basis of the calculated statistic amount at each of the operating points (Step S270). By configuring as above, the characteristic information indicating the characteristics of the smoothing capacitor 101 in the initial state can be accurately acquired from the initial capacitance value including an error caused by variation, a noise or the like in the peripheral environment.

(4) The power conversion apparatus 10 includes the DC-voltage detector 102 that detects the DC voltage Vdc by the DC power, the output-current detector 105 that detects the output current Iout of the second power-conversion unit 104, and the output-voltage detector 106 that detects the output voltage Vout of the second power-conversion unit 104. At Step S230, the capacitance acquiring unit 112 calculates the initial capacitance value on the basis of the DC voltage Vdc, the output current Iout, and the output voltage Vout detected by the DC-voltage detector 102, the output-current detector 105, and the output-voltage detector 106, respectively, during the predetermined initial operation period. Moreover, it calculates the operation capacitance value on the basis of the DC voltage Vdc, the output current Iout, and the output voltage Vout detected by the DC-voltage detector 102, the output-current detector 105, and the output-voltage detector 106, respectively, after the elapse of the initial operation period. By configuring as above, the initial capacitance value and the operation capacitance value of the smoothing capacitor 101 can be accurately calculated, respectively.

(5) The capacitance acquiring unit 112 determines whether the predetermined initial operation period has elapsed or not on the basis of at least either one of the number of pieces of data related to the capacitance value acquired for each value of the AC power and the operation time of the second power-conversion unit 104 (Step S250) and on the basis of the result of the determination, it decides which of the initial capacitance value and the operation capacitance value is to be acquired. By configuring as above, the acquisition of the operation capacitance value can be started at an appropriate timing, and the deterioration state of the smoothing capacitor 101 can be determined by using it.

(6) The capacitance acquiring unit 112 decides whether to continue or end the acquisition of the characteristic information on the basis of the number of the operating points of the second power-conversion unit 104 for which the characteristic information has been acquired (Step S260), and if it decides to continue (Step S260: No), even after the elapse of the initial operation period (Step S250: Yes), acquires the initial capacitance value at Step S230. By configuring as above, if the number of operating points at which the characteristic information has been acquired runs short, even after the elapse of the initial operation period, the acquisition of the initial capacitance value can be continued without starting the acquisition of the operation capacitance value.

Second Embodiment

Figure 5:
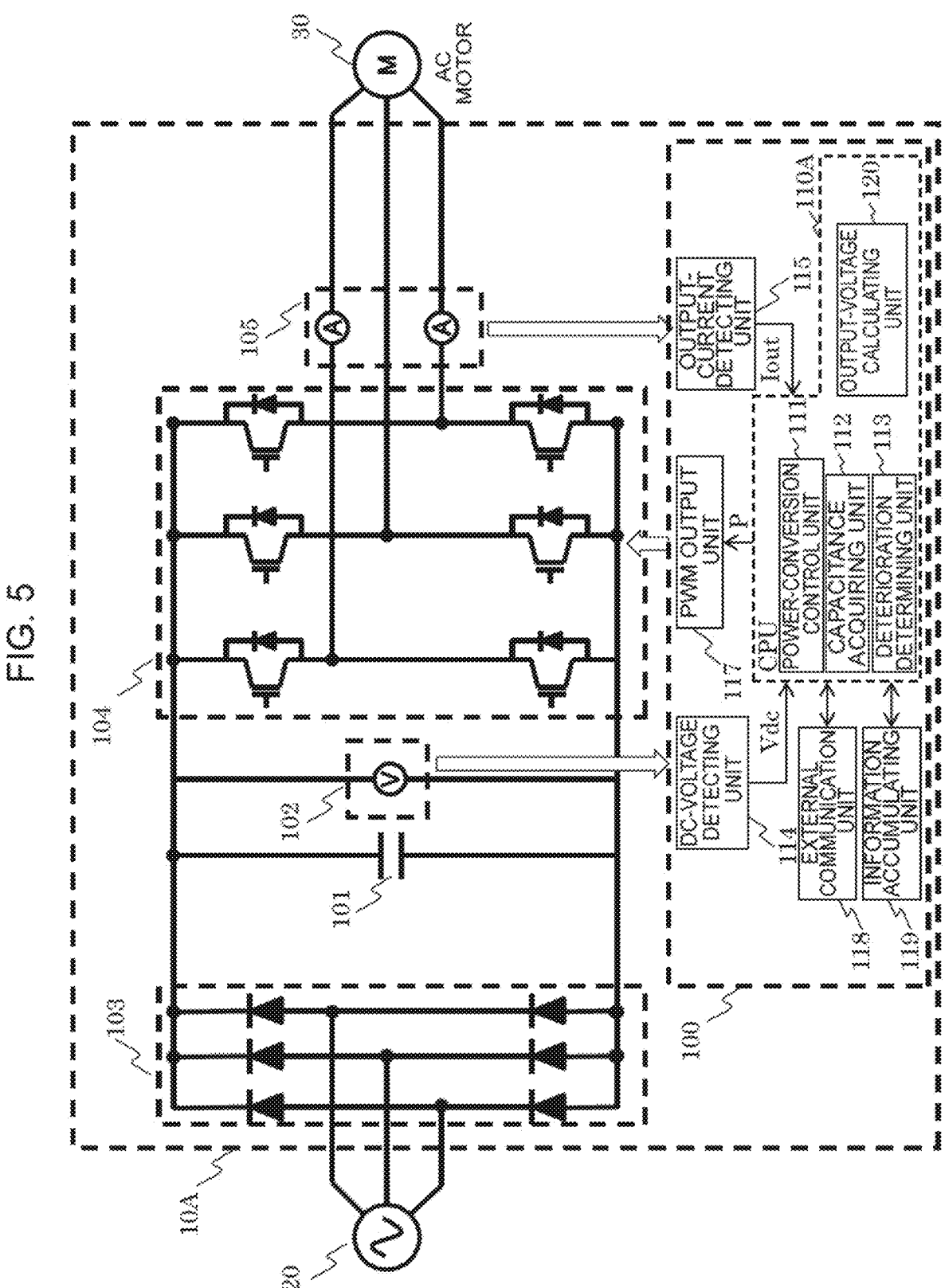
FIG. 5 is a schematic configuration diagram of a motor-drive system using a power conversion apparatus according to a Second Embodiment of the Present Invention.

FIG. 5 is a schematic configuration diagram of a motor-drive system using a power conversion apparatus 10A according to a Second Embodiment of the present invention.

This motor-drive system includes the power conversion apparatus 10A which supplies power to a control target, the three-phase AC power source 20 which supplies power to the power conversion apparatus 10A, and the AC motor 30, which is the control target.

In the power conversion apparatus 10A of this Embodiment, a difference from the power conversion apparatus 10 according to the First Embodiment shown in FIG. 1 is a point that the output-voltage detector 106 is not provided, and a point that a control unit 100A is provided instead of the control unit 100. In the following, explanation on parts in common with the First Embodiment will be omitted.

The control unit 100A includes a CPU 110A, the DC-voltage detecting unit 114, the output-current detecting unit 115, the PWM output unit 117, the external communication unit 118, and the information accumulating unit 119. It is to be noted that, unlike the control unit 100 explained in the First Embodiment, the output-voltage detecting unit 116 is not provided.

The CPU 110A further has each functional block of an output-voltage calculating unit 120 as its function in addition to the power-conversion control unit 111, the capacitance acquiring unit 112, and the deterioration determining unit 113 explained in the First Embodiment.

The output-voltage calculating unit 120 calculates the output voltage Vout of the second power-conversion unit 104 on the basis of an output instruction input from outside the power conversion apparatus 10A. The output-voltage calculating unit 120 can calculates the output voltage Vout of the second power-conversion unit 104 from the voltage instruction value calculated on the basis of the output instruction input from the outside when the power-conversion control unit 111 generates the PWM signal P, for example.

Subsequently, determination of the deterioration state of the smoothing capacitor 101 in the power conversion apparatus 10A in this Embodiment will be explained.

Figure 6:
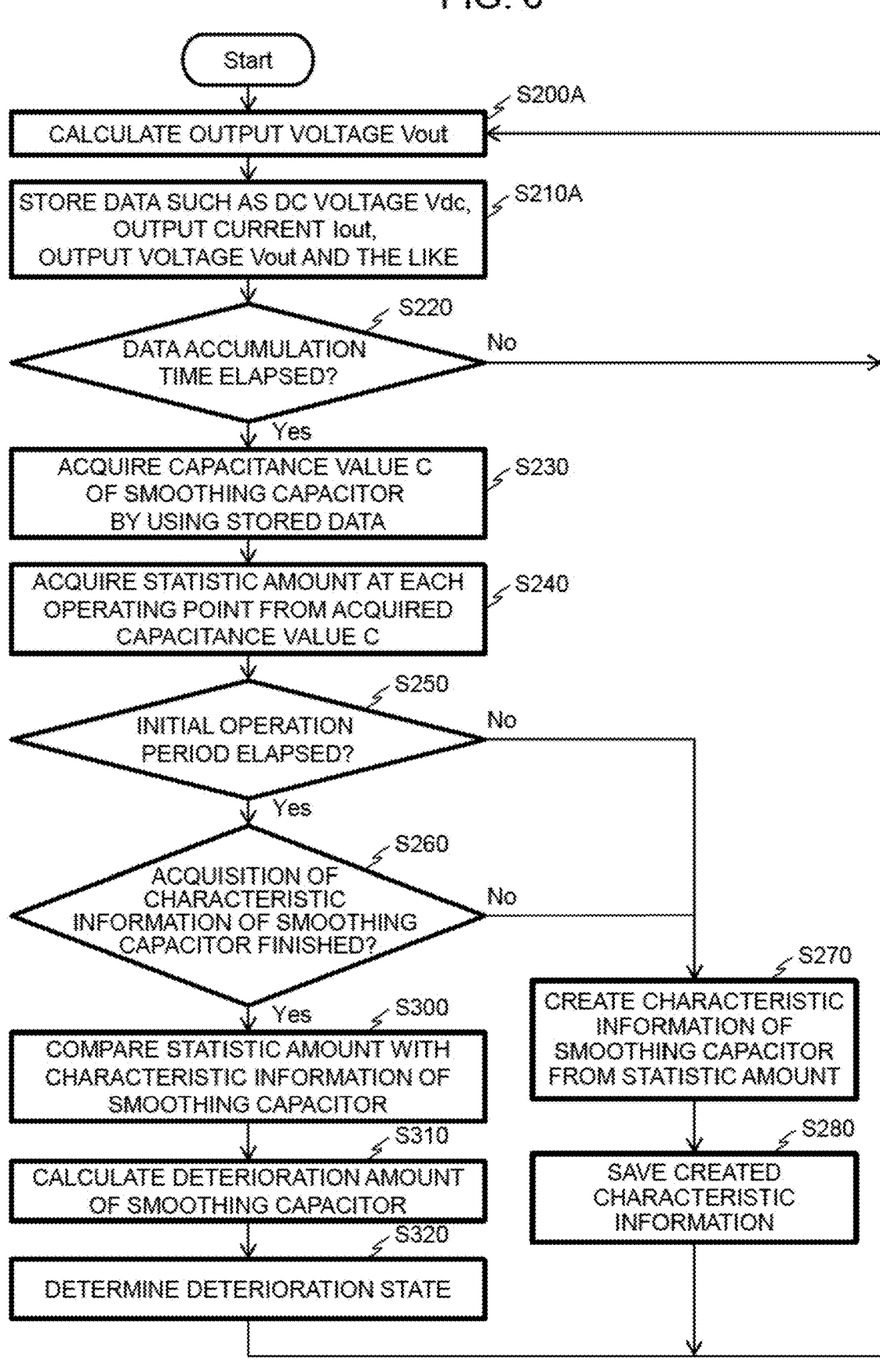
FIG. 6 is a flowchart of smoothing-capacitor deterioration-determination processing according to the Second Embodiment of the Present Invention.

FIG. 6 is a flowchart of the smoothing-capacitor deterioration-determination processing according to the Second Embodiment of the present invention. In the power conversion apparatus 10A of this Embodiment, in the CPU 110A of the control unit 100A, the deterioration state of the smoothing capacitor 101 is determined by executing the processing shown in the flowchart in FIG. 6 in each predetermined arithmetic period.

It is to be noted that, in the flowchart in FIG. 6, parts where the processing in common with the flowchart in FIG. 2 explained in the First Embodiment is executed are given the same Step numbers. In the following, the flowchart in FIG. 6 will be explained by omitting the parts with the same step numbers as those in this FIG. 2.

At Step S200A, the CPU 110A calculates the output voltage Vout by the output-voltage calculating unit 120.

At Step S210A, the CPU 110A acquires data of the DC voltage Vdc and the output current Iout from the DC-voltage detecting unit 114 and the output-current detecting unit 115, respectively, acquires the data of the output voltage Vout calculated at Step S200A, and accumulates these pieces of data in the information accumulating unit 119.

At Step S220 and after, the processing similar to those in FIG. 2 is executed, respectively.

According to the Second Embodiment of the present invention described above, the power conversion apparatus 10A includes the DC-voltage detector 102 that detects the DC voltage Vdc by the DC power, the output-current detector 105 that detects the output current Iout of the second power-conversion unit 104, the power-conversion control unit 111 that controls the second power-conversion unit 104 on the basis of the output instruction input from the outside, and the output-voltage calculating unit 120 that calculates the output voltage Vout of the second power-conversion unit 104 on the basis of the output instruction. At Step S230, the capacitance acquiring unit 112 calculates the initial capacitance value on the basis of the DC voltage Vdc and the output current Iout detected by the DC-voltage detector 102 and the output-current detector 105, respectively, during the predetermined initial operation period and the output voltage Vout calculated by the output-voltage calculating unit 120 on the basis of the output instruction input during the initial operation period. Moreover, it calculates the operation capacitance value on the basis of the DC voltage Vdc and the output current Iout detected by the DC-voltage detector 102 and the output-current detector 105, respectively, after the elapse of the initial operation period and the output voltage Vout calculated by the output-voltage calculating unit 120 on the basis of the output instruction input after the elapse of the initial operation period. By configuring as above, the initial capacitance value and the operation capacitance value of the smoothing capacitor 101 can be accurately calculated, respectively, similarly to the First Embodiment, even without providing the output-voltage detector 106 in the power conversion apparatus 10A.

Third Embodiment

Figure 7:
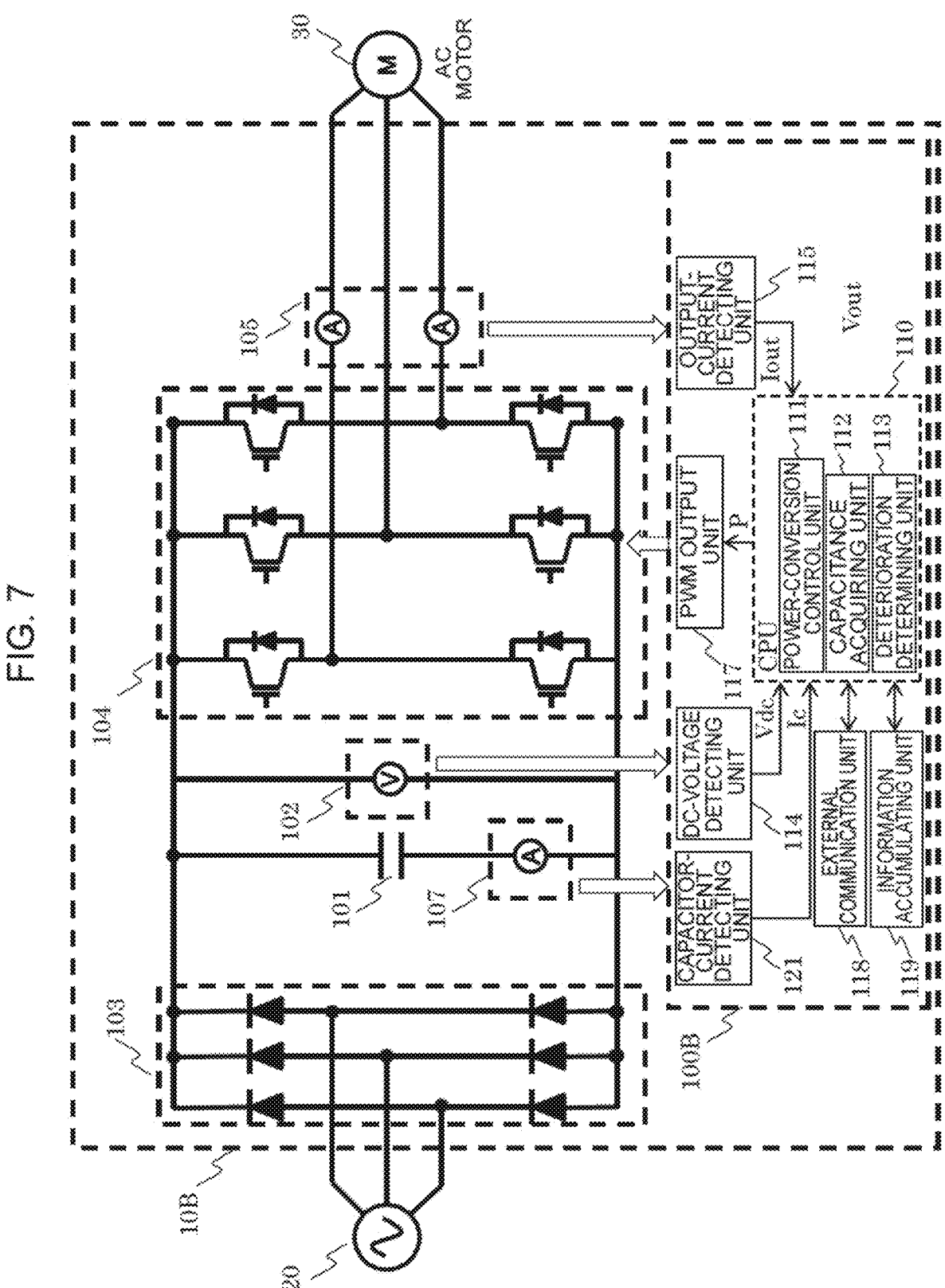
FIG. 7 is a schematic configuration diagram of a motor-drive system using a power conversion apparatus according to a Third Embodiment of the present invention.

FIG. 7 is a schematic configuration diagram of a motor-drive system using a power conversion apparatus 10B according to a Third Embodiment of the present invention. This motor-drive system includes the power conversion apparatus 10B which supplies power to a control target, the three-phase AC power source 20 which supplies power to the power conversion apparatus 10B, and the AC motor 30, which is the control target.

In the power conversion apparatus 10B of this Embodiment, a difference from the power conversion apparatus 10 according to the First Embodiment shown in FIG. 1 is a point that a capacitor-current detector 107 is provided instead of the output-voltage detector 106 and a point that a control unit 100B is provided instead of the control unit 100. In the following, explanation on parts in common with the First Embodiment will be omitted.

The capacitor-current detector 107 detects a current flowing through the smoothing capacitor 101 and outputs a detection signal according to a detection result thereof to the control unit 100B.

The control unit 100B includes the CPU 110, the DC-voltage detecting unit 114, the output-current detecting unit 115, the PWM output unit 117, the external communication unit 118, the information accumulating unit 119, and a capacitor-current detecting unit 121. It is to be noted that, unlike the control unit 100 explained in the First Embodiment, the output-voltage detecting unit 116 is not provided.

The capacitor-current detecting unit 121 handles a detection signal output by the capacitor-current detector 107 as an input, converts it to a capacitor current Ic which is data for calculation, and outputs it to the CPU 110. The capacitor-current detecting unit 121 is configured by an AD converter, for example.

Subsequently, determination of the deterioration state of the smoothing capacitor 101 in the power conversion apparatus 10B in this Embodiment will be explained.

Figure 8:
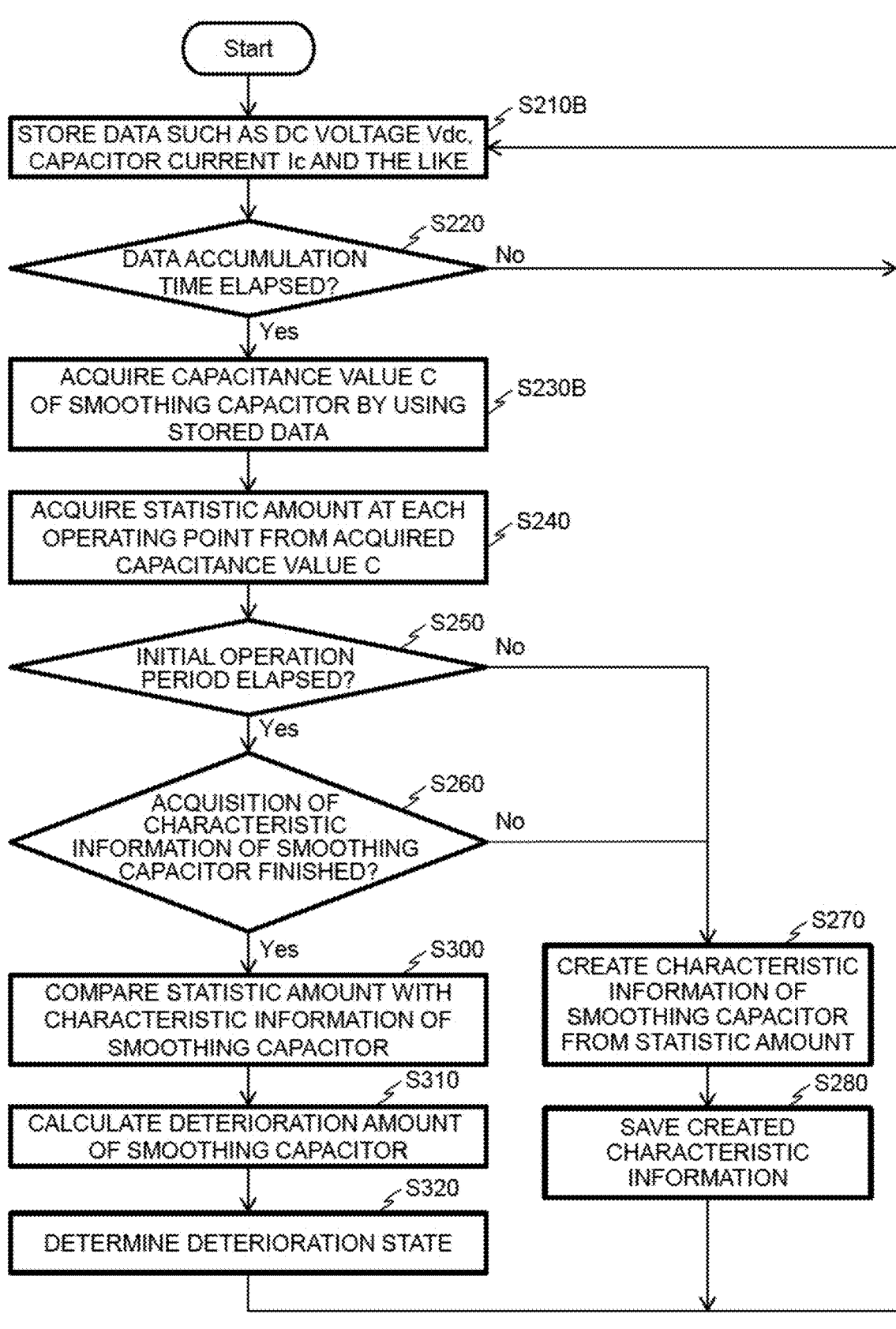
FIG. 8 is a flowchart of smoothing-capacitor deterioration-determination processing according to the Third Embodiment of the present invention.

FIG. 8 is a flowchart of the smoothing-capacitor deterioration-determination processing according to the Third Embodiment of the present invention. In the power conversion apparatus 10B of this Embodiment, in the CPU 110 of the control unit 100B, the deterioration state of the smoothing capacitor 101 is determined by executing the processing shown in the flowchart in FIG. 8 in each predetermined arithmetic period.

It is to be noted that, in the flowchart in FIG. 8, parts where the processing in common with the flowchart in FIG. 2 explained in the First Embodiment is executed are given the same Step numbers. In the following, the flowchart in FIG. 8 will be explained by omitting the parts with the same step numbers as in this FIG. 2.

At Step S210B, the CPU 110 acquires data of the DC voltage Vdc and the capacitor current Ic from the DC-voltage detecting unit 114 and the capacitor-current detecting unit 121, respectively, and accumulates the data in the information accumulating unit 119.

At Step S230B, the CPU 110 acquires the capacitance value C of the smoothing capacitor 101 by using the data accumulated in the information accumulating unit 119 so far by the processing at Step S210B by the capacitance acquiring unit 112. Here, the capacitance values C can be calculated in plural as follows, for example.

By deforming the aforementioned formula (3), the following formula (8) is obtained:

$$C = Ic/(\Delta Vdc/\Delta t) \tag{8}$$

At Step S230B, on the basis of each of the data of the DC voltage Vdc and the capacitor current Ic accumulated in the information accumulating unit 119, the capacitance value C of the smoothing capacitor 101 at each point of time when the data was acquired can be obtained by the formula (8).

At Step S240 and after, the processing similar to those in FIG. 2 is executed, respectively.

According to the Third Embodiment of the present invention explained as above, the power conversion apparatus 10B includes the DC-voltage detector 102 which detects the DC voltage Vdc by the DC power and the capacitor-current detector 107 which detects the capacitor current Ic flowing through the smoothing capacitor 101. At Step S230B, the capacitance acquiring unit 112 calculates the initial capacitance value on the basis of the DC-voltage Vdc and the capacitor current Ic detected by the DC-voltage detector 102 and the capacitor-current detector 107, respectively, during the predetermined initial operation period. Moreover, the operation capacitance value is calculated on the basis of the DC voltage Vdc and the capacitor current Ic detected by the DC-voltage detector 102 and the capacitor-current detector 107, respectively, after the elapse of the initial operation period. By configuring as above, the initial capacitance value and the operation capacitance value of the smoothing capacitor 101 can be accurately calculated, respectively, similarly to the First Embodiment.

Fourth Embodiment

Figure 9:
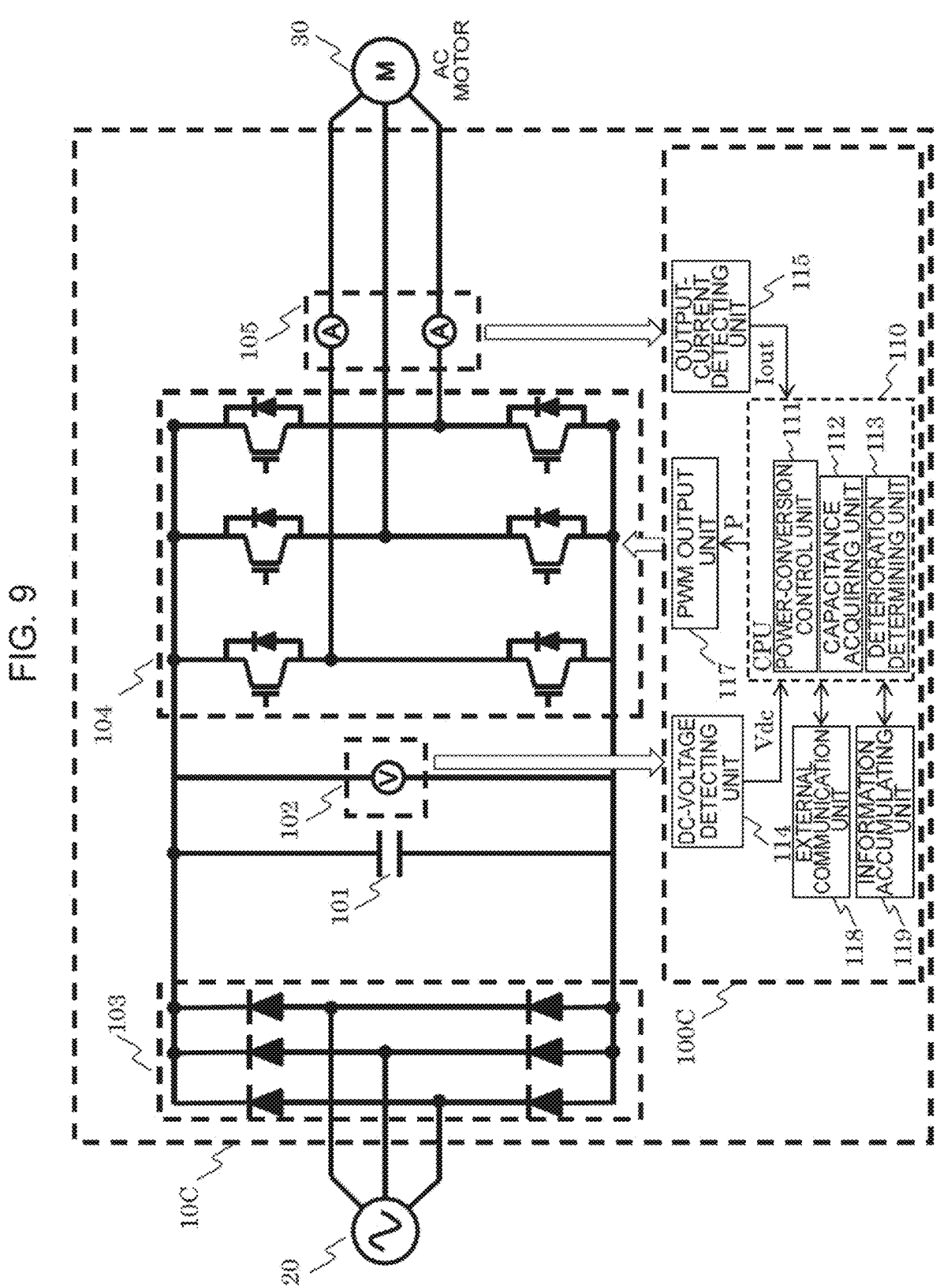
FIG. 9 is a schematic configuration diagram of a motor-drive system using a power conversion apparatus according to a Fourth Embodiment of the present invention.

FIG. 9 is a schematic configuration diagram of a motor-drive system using a power conversion apparatus 10C according to a Fourth Embodiment of the present invention. This motor-drive system includes the power conversion apparatus 10C which supplies power to a control target, the three-phase AC power source 20 which supplies power to the power conversion apparatus 10C, and the AC motor 30, which is the control target.

In the power conversion apparatus 10C of this Embodiment, a difference from the power conversion apparatus 10 according to the First Embodiment shown in FIG. 1 is a point that the output-voltage detector 106 is not provided, and a point that a control unit 100C is provided instead of the control unit 100. In the following, explanation on parts in common with the First Embodiment will be omitted.

The control unit 100C includes the CPU 110, the DC-voltage detecting unit 114, the output-current detecting unit 115, the PWM output unit 117, the external communication unit 118, and the information accumulating unit 119. It is to be noted that, unlike the control unit 100 explained in the First Embodiment, the output-voltage detecting unit 116 is not provided.

Subsequently, determination of the deterioration state of the smoothing capacitor 101 in the power conversion apparatus 10C in this Embodiment will be explained.

Figure 10:
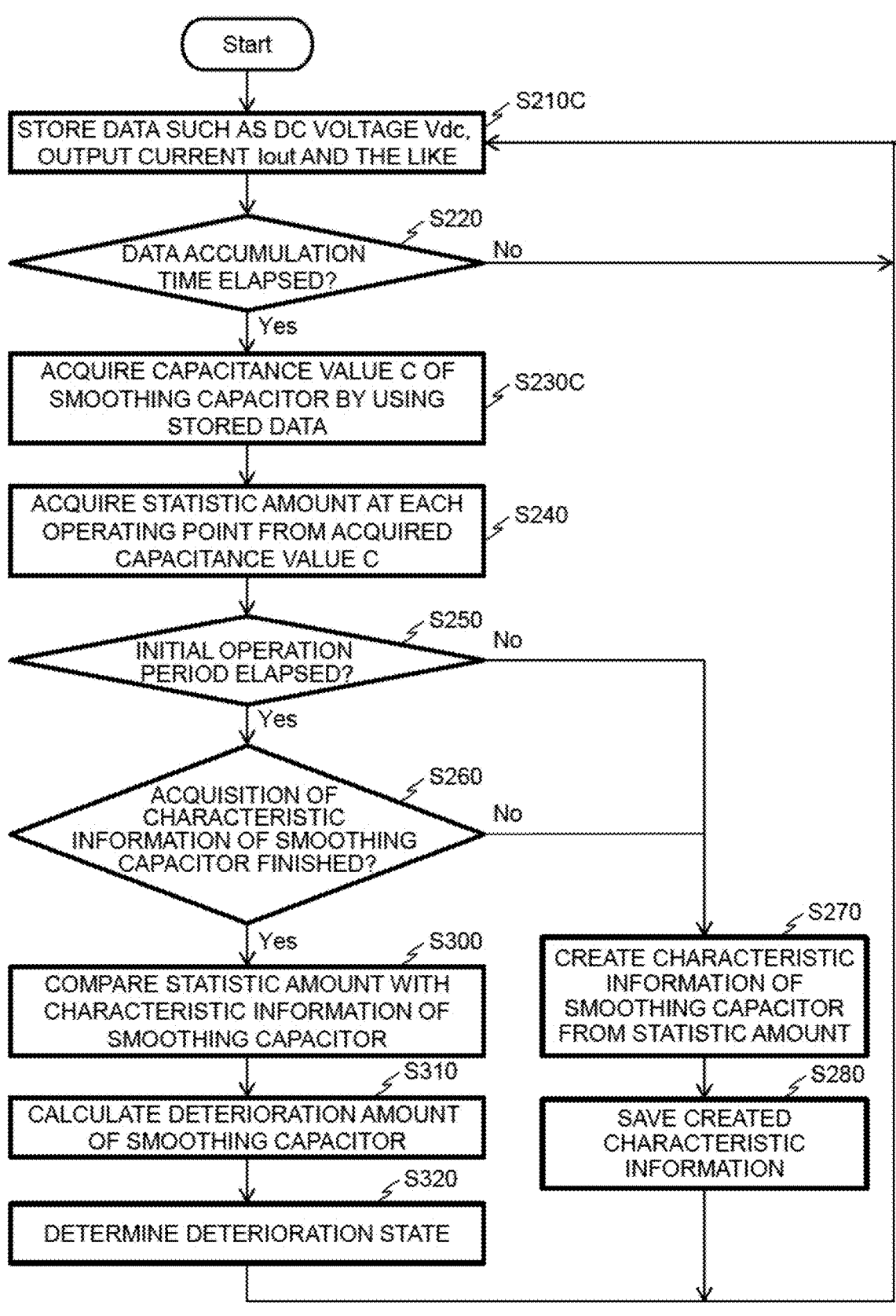
FIG. 10 is a flowchart of smoothing-capacitor deterioration-determination processing according to the Fourth Embodiment of the present invention.

FIG. 10 is a flowchart of the smoothing-capacitor deterioration-determination processing according to the Fourth Embodiment of the present invention. In the power conversion apparatus 10C of this Embodiment, in the CPU 110 of the control unit 100C, the deterioration state of the smoothing capacitor 101 is determined by executing the processing shown in the flowchart in FIG. 10 in each predetermined arithmetic period.

It is to be noted that, in the flowchart in FIG. 10, parts where the processing in common with the flowchart in FIG. 2 explained in the First Embodiment is executed are given the same Step numbers. In the following, the flowchart in FIG. 10 will be explained by omitting the parts with the same step numbers as in this FIG. 2.

At Step S210C, the CPU 110 acquires data of the DC voltage Vdc and the output current Iout from the DC-voltage detecting unit 114 and the output-current detecting unit 115, respectively, and accumulates the data in the information accumulating unit 119.

At Step S230C, the CPU 110 acquires the capacitance value C of the smoothing capacitor 101 by using the data accumulated in the information accumulating unit 119 so far by the processing at Step S210C by the capacitance acquiring unit 112. Here, the capacitance values C can be calculated in plural as follows, for example.

At the timing when the current flows from the smoothing capacitor 101 to the second power-conversion unit 104, if the output current Iout of the second power-conversion unit 104 is small, a relationship in the following formula (9) is established between the capacitor current Ic and the output current Iout. It is to be noted that, in the formula (9), k denotes a predetermined conversion coefficient and is decided in advance on the basis of various parameters of the power conversion apparatus 10C, prior experiment results and the like.

$$Ic = Iout \times (1 - k \times Iout) \qquad (9)$$

By substituting the formula (9) in the aforementioned formula (8), the following formula (10) is obtained:

$$C = Iout \times (1 - k \times Iout)/(\Delta Vdc/\Delta t) \qquad (10)$$

At Step S230C, on the basis of each of the data of the DC voltage Vdc and the output current Iout accumulated in the information accumulating unit 119, the capacitance value C of the smoothing capacitor 101 at each point of time when the data was acquired can be obtained by the formula (10).

At Step S240 and after, the processing similar to those in FIG. 2 is executed, respectively.

According to the Fourth Embodiment of the present invention explained as above, the power conversion apparatus 10C includes the DC-voltage detector 102 which detects the DC voltage Vdc by the DC power and the output-current detector 105 which detects the output current Iout of the second power-conversion unit 104. At Step S230C, the capacitance acquiring unit 112 calculates the initial capacitance value on the basis of the DC-voltage Vdc and the output current Iout detected by the DC-voltage detector 102 and the output-current detector 105, respectively, during the predetermined initial operation period. Moreover, it calculates the operation capacitance value on the basis of the DC voltage Vdc and the output current Iout detected by the DC-voltage detector 102 and the output-current detector 105, respectively, after the elapse of the initial operation period. By configuring as above, the initial capacitance value and the operation capacitance value of the smoothing capacitor 101 can be accurately calculated, respectively, similarly to the First Embodiment, even without providing the output-voltage detector 106 in the power conversion apparatus 10C.

Fifth Embodiment

Subsequently, a Fifth Embodiment of the present invention will be explained. It is to be noted that the power conversion apparatus of this Embodiment has a configuration similar to any one of the power conversion apparatuses 10, 10A, 10B, 10C explained in the First to Fourth Embodiment, respectively. In the following, by using the configuration of the power conversion apparatus 10 in FIG. 1 explained in the First Embodiment as an example, determination of a deterioration state of the smoothing capacitor 101 in the power conversion apparatus of this Embodiment will be explained.

Figure 11:
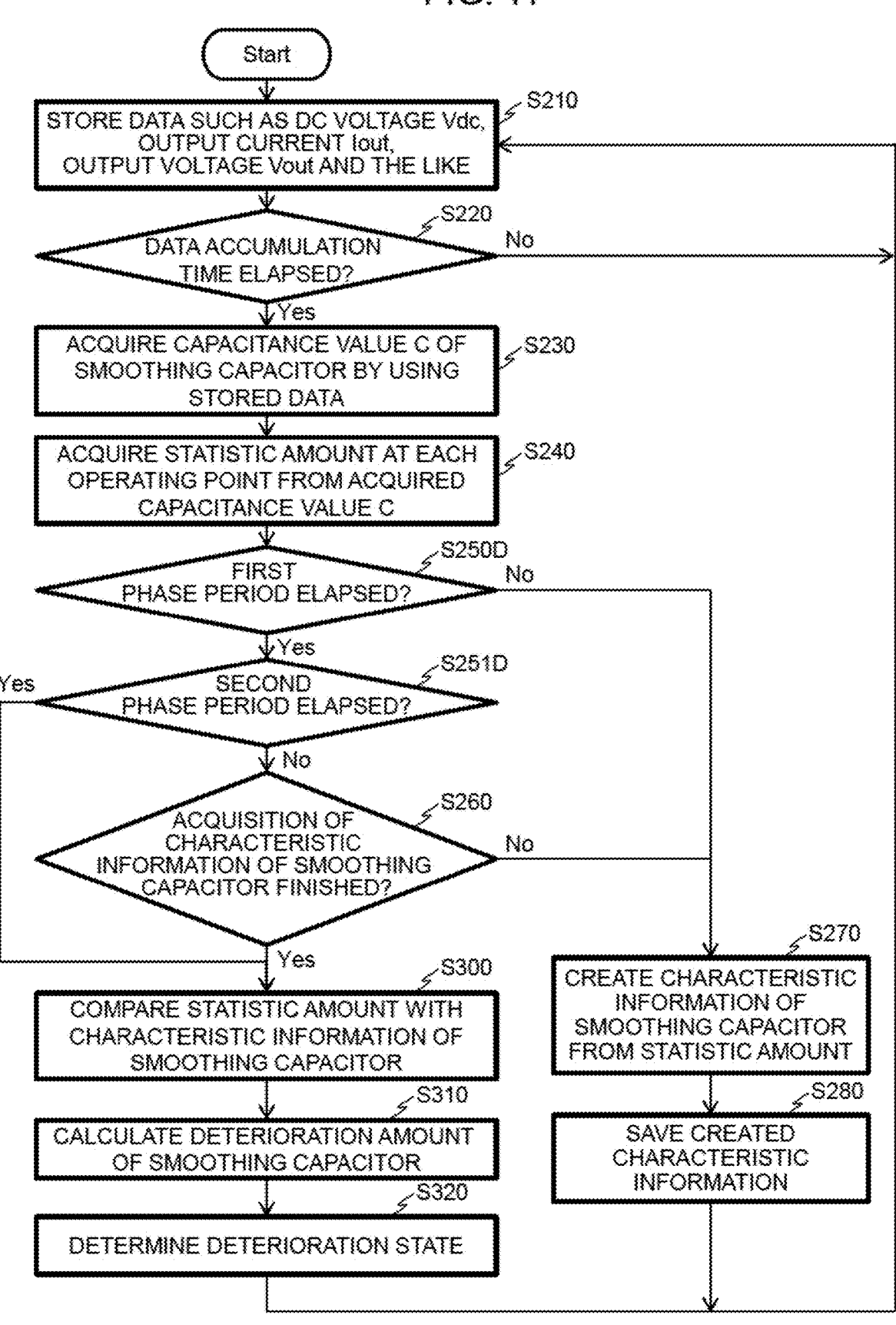
FIG. 11 is a flowchart of smoothing-capacitor deterioration-determination processing according to a Fifth Embodiment of the present invention.

FIG. 11 is a flowchart of smoothing-capacitor deterioration-determination processing according to the Fifth Embodiment of the present invention. In the power conversion apparatus 10 in this Embodiment, in the CPU 110 of the control unit 100, the deterioration state of the smoothing capacitor 101 is determined by executing the processing shown in the flowchart in FIG. 11 in each predetermined arithmetic period.

It is to be noted that, in the flowchart in FIG. 11, parts where the processing in common with the flowchart in FIG. 2 explained in the First Embodiment is executed are given the same Step numbers. In the following, the flowchart in FIG. 11 will be explained by omitting the parts with the same step numbers as in this FIG. 2.

At Step S250D, the CPU 110 determines whether a predetermined first phase period has elapsed or not since the operation of the power conversion apparatus 10 was started. The first phase period is a period determined in advance as a period for acquiring the initial capacitance value of the smoothing capacitor 101 and for calculating the characteristic information thereof and corresponds to the aforementioned initial operation period. Here, by a method similar to that in the aforementioned Step S250, for example, it can be determined whether the first phase period has elapsed or not.

If it is determined that the first phase period has not elapsed yet by the determination processing at Step S250D, the processing in FIG. 11 is caused to proceed to Step S270.

On the other hand, if it is determined that the first phase period has elapsed, the processing in FIG. 11 is caused to proceed to Step S251D.

At Step S251D, the CPU 110 determines whether a predetermined second phase period has elapsed or not since the operation of the power conversion apparatus 10 was started. The second phase period is a period determined in advance as a period during which the calculation of the characteristic information of the smoothing capacitor 101 is finished, and the determination of the deterioration state is started, even if the determination condition at Step S260 described above is not satisfied, and a period longer than the aforementioned first phase period, that is, a period of twice thereof, for example, is set. Here, by means of a method similar to that at Step S250D, it can be determined whether the second phase period has elapsed or not.

If it is determined that the second phase period has not elapsed yet by the determination processing at Step S251D, the processing in FIG. 11 is caused to proceed to Step S260. On the other hand, if it is determined that the second phase period has elapsed, the processing in FIG. 11 is caused to proceed to Step S300.

At Step S260 and after, the processing similar to those in FIG. 2 is executed, respectively.

According to the Fifth Embodiment of the present invention explained as above, operations and effects similar to that of the First Embodiment is exerted.

It is to be noted that, as an application example of this Embodiment, the example in which the processing shown in the flowchart in FIG. 11 is executed in the configuration of the power conversion apparatus 10 in FIG. 1 explained in the First Embodiment is explained, but this Embodiment may be applied in the configurations of the power conversion apparatuses 10A, 10B, 10C explained in each of the Second to Fourth Embodiments. Specifically, this Embodiment can be applied by replacing the processing at Step S250 with Steps S250D, S251D in FIG. 11 in each of the flowcharts in FIG. 6, FIG. 8, FIG. 10.

It is to be noted that, in each of the aforementioned Embodiments, such a form that capacitance calculation, statistic-amount calculation of the smoothing capacitor 101 and each processing such as deterioration determination of the smoothing capacitor 101 are executed by the CPU 110, 110A provided in each of the control units 100, 100A, 100B, 100C is explained, but the present invention is not limited to that. For example, it may be so configured that data required for the processing is transmitted from the external communication unit 118 to an external device, and the processing is executed by the external device.

The present invention is not limited to the aforementioned Embodiments or variations, but various changes can be made within a range not departing from the gist of the present invention. The aforementioned embodiments are for explaining the present invention so as to be understood easily, for example, and do not necessarily have to include all the constituent elements. Arbitrary addition, deletion, replacement of the constituent elements can be made within a range not departing from the present invention.

REFERENCE SIGNS LIST 10, 10A, 10B, 10C Power conversion apparatus
20 Three-phase AC power source
30 AC motor
100, 100A, 100B, 100C Control unit
101 Smoothing capacitor
102 DC-voltage detector 103 First power-conversion unit
104 Second power-conversion unit
105 Output-current detector
106 Output-voltage detector
107 Capacitor-current detector
110, 110A CPU
111 Power-conversion control unit
112 Capacitance acquiring unit
113 Deterioration determining unit
114 DC-voltage detecting unit
115 Output-current detecting unit
116 Output-voltage detecting unit
117 PWM output unit
118 External communication unit
119 Information accumulating unit
120 Output-voltage calculating unit
121 Capacitor-current detecting unit

The invention claimed is:

1. A power conversion apparatus, comprising:
a power conversion unit that converts DC power to AC power and outputs the AC power;
a smoothing capacitor that smoothens the DC power;
a capacitance acquiring unit that acquires a capacitance value of the smoothing capacitor; and
a deterioration determining unit that determines a deterioration state of the smoothing capacitor, wherein
the capacitance acquiring unit acquires a plurality of initial capacitance values indicating capacitance values of the smoothing capacitor in an initial state in accordance with a change in an operation state of the power conversion unit and acquires a plurality of operation capacitance values indicating capacitance values of the smoothing capacitor in the operation state; and
the deterioration determining unit:
acquires characteristic information indicating a relationship between the AC power and the capacitance value of the smoothing capacitor in the initial state on the basis of a statistic amount of the plurality of initial capacitance values acquired by the capacitance acquiring unit, wherein the smoothing capacitor is in an initial state when a predetermined initial operation period has not elapsed or the acquisition of the characteristic information of the smoothing capacitor has not been finished, and wherein a statistic amount of the initial capacitance values is an average value, a median value, a standard deviation, an upper fence, and a lower fence thereof; and
determines a deterioration state of the smoothing capacitor on the basis of a statistic amount of the plurality of operation capacitance values acquired by the capacitance acquiring unit and the characteristic information.

2. The power conversion apparatus according to claim 1, wherein
the deterioration determining unit calculates a deterioration amount of the smoothing capacitor on the basis of the statistic amount of the operation capacitance value and the characteristic information and determines the deterioration state of the smoothing capacitor on the basis of a comparison result between the calculated deterioration amount and a predetermined threshold value.

3. The power conversion apparatus according to claim 1, wherein
the deterioration determining unit calculates a statistic amount including at least any one of an average value, a median value, a standard deviation, an upper fence, and a lower fence of the initial capacitance value at each operating point set by separating the values of the AC power by each predetermined range and acquires the characteristic information on the basis of the calculated statistic amount at each of the operating points.

4. The power conversion apparatus according to claim 1, comprising:

a DC-voltage detector that detects a DC voltage by the DC power;

an output-current detector that detects an output current of the power conversion unit; and an output-voltage detector that detects an output voltage of the power conversion unit, wherein the capacitance acquiring unit:

calculates the initial capacitance value on the basis of the DC voltage, the output current, and the output voltage detected by the DC-voltage detector, the output-current detector, and the output-voltage detector, respectively, during a predetermined initial operation period; and calculates the operation capacitance value on the basis of the DC voltage, the output current, and the output voltage detected by the DC-voltage detector, the output-current detector, and the output-voltage detector, respectively, after elapse of the initial operation period.

5. The power conversion apparatus according to claim 1, comprising:

a DC-voltage detector that detects a DC voltage by the DC power;

an output-current detector that detects an output current of the power conversion unit;

a power-conversion control unit that controls the power conversion unit on the basis of an output instruction input from an outside; and an output-voltage calculating unit that calculates an output voltage of the power conversion unit on the basis of the output instruction, wherein the capacitance acquiring unit:

calculates the initial capacitance value on the basis of the DC voltage and the output current detected by the DC-voltage detector and the output-current detector, respectively, during a predetermined initial operation period and the output voltage calculated by the output-voltage calculating unit on the basis of the output instruction input during the initial operation period; and calculates the operation capacitance value on the basis of the DC voltage and the output current detected by the DC-voltage detector and the output-current detector, respectively, after elapse of the initial operation period and the output voltage calculated by the output-voltage calculating unit on the basis of the output instruction input after elapse of the initial operation period.

6. The power conversion apparatus according to claim 1, comprising:

a DC-voltage detector that detects a DC voltage by the DC power; and a capacitor-current detector that detects a capacitor current flowing through the smoothing capacitor, wherein the capacitance acquiring unit:

calculates the initial capacitance value on the basis of the DC voltage and the capacitor current detected by the DC-voltage detector and the capacitor-current detector, respectively, during a predetermined initial operation period; and calculates the operation capacitance value on the basis of the DC voltage and the capacitor current detected by the DC-voltage detector and the capacitor-current detector, respectively, after elapse of the initial operation period.

7. The power conversion apparatus according to claim 1, comprising:

a DC-voltage detector that detects a DC voltage by the DC power; and an output-current detector that detects an output current of the power conversion unit, wherein the capacitance acquiring unit:

calculates the initial capacitance value on the basis of the DC voltage and the output current detected by the DC-voltage detector and the output-current detector, respectively, during a predetermined initial operation period; and calculates the operation capacitance value on the basis of the DC voltage and the output current detected by the DC-voltage detector and the output-current detector, respectively, after elapse of the initial operation period.

8. The power conversion apparatus according to claim 1, wherein the capacitance acquiring unit determines whether a predetermined initial operation period has elapsed or not on the basis of at least either one of the number of pieces of data related to the capacitance value acquired for each value of the AC power and an operation time of the power conversion unit and decides which of the initial capacitance value and the operation capacitance value is to be acquired on the basis of a result of the determination.

9. The power conversion apparatus according to claim 8, wherein the capacitance acquiring unit decides whether acquisition of the characteristic information is to be continued or to be ended on the basis of the number of operating points of the power conversion unit for which the characteristic information has been acquired, and if it is decided to continue, acquires the initial capacitance value even after elapse of the initial operation period.

10. A deterioration determination method of a smoothing capacitor for determining a deterioration state of a smoothing capacitor which is coupled to a power conversion unit and smoothens DC power, the power conversion unit converting the DC power to AC power and outputting the AC power, comprising:

acquiring a plurality of initial capacitance values indicating capacitance values of the smoothing capacitor in an initial state in accordance with a change in an operation state of the power conversion unit;

acquiring characteristic information indicating a relationship between the AC power and a capacitance value of the smoothing capacitor in the initial state on the basis of a statistic amount of the plurality of acquired initial capacitance values, wherein the smoothing capacitor is in an initial state when a predetermined initial operation period has not elapsed or the acquisition of the characteristic information of the smoothing capacitor has not been finished, and wherein a statistic amount of the initial capacitance values is an average value, a median value, a standard deviation, an upper fence, and a lower fence thereof;

acquiring a plurality of operation capacitance values indicating capacitance values of the smoothing capacitor in the operation state; and determining a deterioration state of the smoothing capacitor on the basis of a statistic amount of the plurality of acquired operation capacitance values and the characteristic information.

* * * * *